(12) United States Patent
Tsai et al.

(10) Patent No.: US 9,601,410 B2
(45) Date of Patent: Mar. 21, 2017

(54) SEMICONDUCTOR DEVICE AND METHOD

(71) Applicant: Taiwan Semiconductor Manufacturing Company, Ltd., Hsin-Chu (TW)

(72) Inventors: Cheng-Chun Tsai, Hsin-Chu (TW); Hung-Pin Chang, Taipei (TW); Ku-Feng Yang, Baoshan Township (TW); Yi-Hsiu Chen, Hsin-Chu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/591,809

(22) Filed: Jan. 7, 2015

(65) Prior Publication Data
US 2016/0197029 A1    Jul. 7, 2016

(51) Int. Cl.
| | |
|---|---|
| *H01L 23/04* | (2006.01) |
| *H01L 23/48* | (2006.01) |
| *H01L 23/00* | (2006.01) |
| *H01L 21/768* | (2006.01) |
| *H01L 21/48* | (2006.01) |

(52) U.S. Cl.
CPC ...... *H01L 23/481* (2013.01); *H01L 21/76898* (2013.01); *H01L 24/94* (2013.01); *H01L 21/486* (2013.01); *H01L 2225/06541* (2013.01); *H01L 2225/06544* (2013.01)

(58) Field of Classification Search
CPC . H01L 2225/06541; H01L 2225/06544; H01L 21/486; H01L 21/76898; H01L 23/481

USPC .................................. 257/698; 438/667, 455
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,955,895 B2 | 6/2011 | Yang et al. |
| 7,973,413 B2 | 7/2011 | Kuo et al. |
| 8,105,875 B1 | 1/2012 | Hu et al. |
| 8,158,456 B2 | 4/2012 | Chen et al. |

(Continued)

FOREIGN PATENT DOCUMENTS

| | | |
|---|---|---|
| TW | 201019423 A | 5/2010 |
| TW | 201104771 A | 2/2011 |
| TW | 201133756 A | 10/2011 |

*Primary Examiner* — Kimberly Rizkallah
*Assistant Examiner* — Maria Ligai
(74) *Attorney, Agent, or Firm* — Slater Matsil, LLP

(57) ABSTRACT

A semiconductor device and method are provided which utilizes a single mask to form openings for both a through substrate via as well as for a through dielectric via. In an embodiment a contact etch stop layer is deposited over and between a first semiconductor device and a second semiconductor device. A dielectric material is deposited over the contact etch stop layer between the first semiconductor device and the second semiconductor device. The different materials of the contact etch stop layer and the dielectric material is utilized such that a single mask may be used to form a through substrate via through the first semiconductor device and also to form a through dielectric via through the dielectric material.

20 Claims, 12 Drawing Sheets

(56) References Cited

U.S. PATENT DOCUMENTS

| | | |
|---|---|---|
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,466,059 B2 | 6/2013 | Chang et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2007/0045814 A1* | 3/2007 | Yamamoto ............ H01G 4/236 257/698 |
| 2008/0116584 A1 | 5/2008 | Sitaram |
| 2010/0187676 A1* | 7/2010 | Suh ................. H01L 23/481 257/692 |
| 2010/0218818 A1* | 9/2010 | Kang ............. H01L 31/02168 136/256 |
| 2011/0175215 A1* | 7/2011 | Farooq ............. H01L 23/481 257/686 |
| 2012/0193814 A1* | 8/2012 | Dunne ............. H01L 23/481 257/774 |
| 2014/0001645 A1 | 1/2014 | Lin et al. |
| 2014/0225258 A1 | 8/2014 | Chiu et al. |
| 2014/0252572 A1 | 9/2014 | Hou et al. |

* cited by examiner

SEMICONDUCTOR DEVICE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
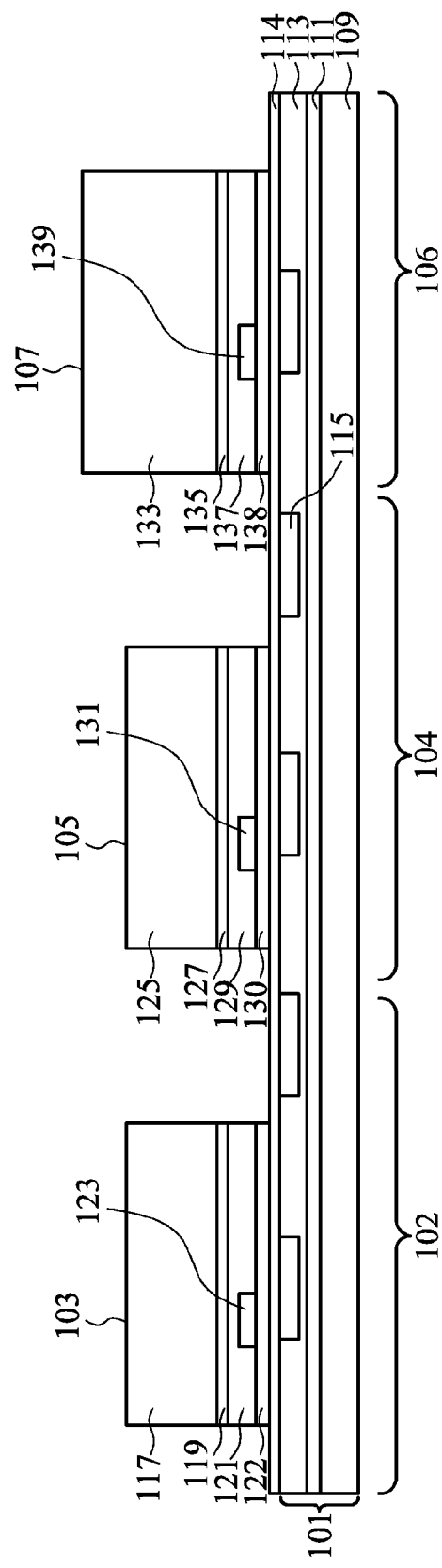
FIG. 1 illustrates a first semiconductor device, a second semiconductor device, and a third semiconductor device bonded to a first wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a first wafer 101 with a first semiconductor device 103, a second semiconductor device 105, and a third semiconductor device 107 bonded to the first wafer 101 in a chip on wafer (CoW) bonding configuration. In an embodiment the first wafer 101 comprises a first substrate 109, a first active device layer 111, first metallization layers 113, a first passivation layer 114, and first contact pads 115.

In an embodiment the first substrate 109, the first active device layer 111, the first metallization layers 113, the first passivation layer 114, and the first contact pads 115 are manufactured to form, e.g., a fourth semiconductor device 102, a fifth semiconductor device 104, and a sixth semiconductor device 106. The fourth semiconductor device 102 is designed to work in conjunction with, e.g., the first semiconductor device 103, the fifth semiconductor device 104 is designed to work in conjunction with, e.g., the second semiconductor device 105, and the sixth semiconductor device 106 is designed to work with, e.g., the third semiconductor device 107.

The first substrate 109 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, glass substrates, ceramic substrates, or hybrid orientation substrates.

The optional first active device layer 111 within the first wafer 101 may comprise a wide variety of active devices and passive devices such as transistors, capacitors, resistors, inductors and the like that may be used to generate the desired structural and functional desires of the design for the first wafer 101. The active devices within the first wafer 101 may be formed using any suitable methods either within or else on the first substrate 109.

The first metallization layers 113 are formed over the first substrate 109 and, if present, the active devices within the first active device layer 111 and may be used to connect, e.g., the subsequently-attached first semiconductor device 103, the second semiconductor device 105, and the third semiconductor device 107 with the active devices within the active device layer 111. In an embodiment the first metallization layers 113 are formed of alternating layers of dielectric and conductive material and may be formed through any suitable process (such as deposition, damascene, dual damascene, etc.). In an embodiment there may be four layers of metallization, but the precise number of layers of dielectric and conductive material is dependent upon the design of the fourth semiconductor device 102, the fifth semiconductor device 104, and the sixth semiconductor device 106.

The first contact pads 115 may be formed over and in electrical contact with the first metallization layers 113 in order to provide external connections for the fourth semiconductor device 102, the fifth semiconductor device 104, and the sixth semiconductor device 106. The first contact pads 115 are formed of a conductive material such as aluminum, although other suitable materials, such as copper, tungsten, or the like, may alternatively be utilized. The first contact pads 115 may be formed using a process such as CVD, although other suitable materials and methods may alternatively be utilized. Once the material for the first contact pads 115 has been deposited, the material may be shaped into the first contact pads 115 using, e.g., a photolithographic masking and etching process.

The first passivation layer 114 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 114 may be formed through a process such as chemical vapor deposition (CVD), although any suitable process may be utilized, and may have a thickness between about 0.5 μm and about 5 μm, such as about 9.25 KÅ. Once formed, the first passivation layer 114 may be patterned in order to expose at least a portion of the first contact pads 115 using, e.g., a photolithographic masking and etching process.

The first semiconductor device 103 may comprise a second substrate 117, a second active device layer 119, second metallization layers 121, a second passivation layer 122, and second contact pads 123. In an embodiment the second substrate 117, the second active device layer 119, the second metallization layers 121, the second passivation layer 122, and the second contact pads 123 may be similar to the first substrate 109, the first active device layer 111, the first metallization layers 113, the first passivation layer 114, and the first contact pads 115 (described above), although they may alternatively be different. However, in this embodiment the first semiconductor device 103 has already been singulated into a single chip prior to bonding.

The second semiconductor device 105 may comprise a third substrate 125, a third active device layer 127, third metallization layers 129, a third passivation layer 130, and third contact pads 131. In an embodiment the third substrate 125, the third active device layer 127, the third metallization layers 129, the third passivation layer 130, and the third contact pads 131 may be similar to the first substrate 109, the first active device layer 111, the first metallization layers 113, the first passivation layer 114, and the first contact pads 115 (described above), although they may alternatively be different. However, in this embodiment the second semiconductor device 105 has already been singulated into a single chip prior to bonding.

The third semiconductor device 107 may comprise a fourth substrate 133, a fourth active device layer 135, fourth metallization layers 137, a fourth passivation layer 138, and fourth contact pads 139. In an embodiment the fourth substrate 133, the fourth active device layer 135, the fourth metallization layers 137, the fourth passivation layer 138, and the fourth contact pads 139 may be similar to the first substrate 109, the first active device layer 111, the first metallization layers 113, the first passivation layer 114 and the first contact pads 115 (described above), although they may alternatively be different. However, in this embodiment the third semiconductor device 107 has already been singulated into a single chip prior to bonding.

In an embodiment the first semiconductor device 103, the second semiconductor device 105, and the third semiconductor device 107 are manufactured using similar designs and similar processes. However, because of processing irregularities, the precise thickness of each of the first semiconductor device 103, the second semiconductor device 105, and the third semiconductor device 107 may not be exact. For example, and as illustrated in FIG. 1, the third semiconductor device 107 may have an overall thickness that is greater than either the first semiconductor device 103 or the second semiconductor device 105.

The first semiconductor device 103, the second semiconductor device 105, and the third semiconductor device 107 may be bonded to the first wafer 101 utilizing, e.g., a fusion bonding process. In an embodiment the fusion bonding process may be initiated by performing an initial cleaning process on the first wafer 101 where the bonds are desired. In a particular embodiment the first wafer 101 may be cleaned using, e.g., a wet cleaning procedure such as an SC-1 or SC-2 cleaning procedure to form a hydrophilic surface. Once cleaned, the first semiconductor device 103, the second semiconductor device 105, and the third semiconductor device 107 are aligned into their respective desired positions on the first wafer 101 and the hydrophilic surface is placed into physical contact with the first semiconductor device 103, the second semiconductor device 105, and the third semiconductor device 107 to begin the bonding procedure. Once the first semiconductor device 103, the second semiconductor device 105, and the third semiconductor device 107 have been contacted to the first wafer 101, a thermal anneal may be utilized to strengthen the bonds.

However, the descriptions of the fusion bonding as described above is merely an example of one type of process that may be utilized in order to bond the first semiconductor device 103, the second semiconductor device 105, and the third semiconductor device 107 to the first wafer 101, and is not intended to be limiting upon the embodiments. Rather, any suitable bonding process may alternatively be utilized to bond the first semiconductor device 103, the second semiconductor device 105, and the third semiconductor device 107 to the first wafer 101, and all such processes are fully intended to be included within the embodiments.

Figure 2:
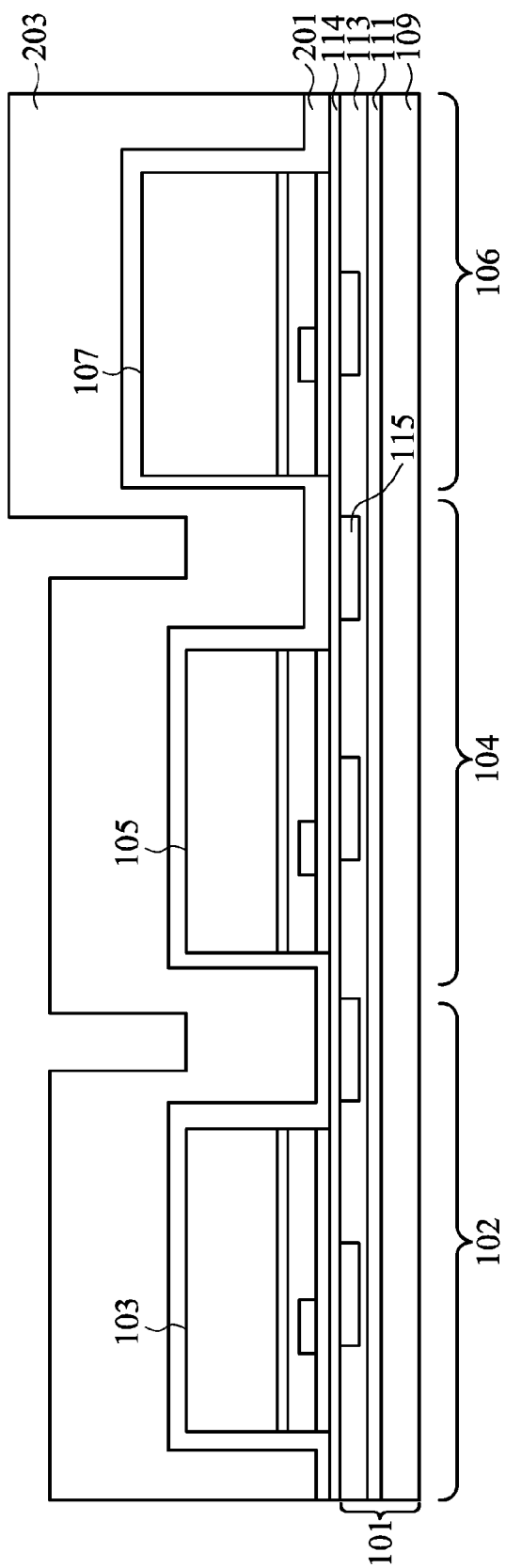
FIG. 2 illustrates a placement of an etch stop layer and a dielectric material over the first semiconductor device, the second semiconductor device, and the third semiconductor device, in accordance with some embodiments.

FIG. 2 illustrates a placement of a contact etch stop layer (CESL) 201 and a deposition of a dielectric material 203 over the first semiconductor device 103, the second semiconductor device 105, the third semiconductor device 107, and the first wafer 101. The CESL 201 is used to protect the first semiconductor device 103, the second semiconductor device 105, the third semiconductor device 107, and the first wafer 101 from damage caused by further processing and provide for a control point for further etching processes. In one embodiment, the CESL 201 may be formed of silicon nitride using plasma enhanced chemical vapor deposition (PECVD), although other materials such as nitride, oxynitride, carbide, boride, combinations thereof, or the like, and alternative techniques of forming the CESL 201, such as low pressure CVD (LPCVD), PVD, or the like, could alternatively be used. The CESL 201 may have a thickness of between about 50 Å and about 2,000 Å, such as about 200 Å.

Once the CESL 201 has been formed, the dielectric material 203 may be formed over the CESL 201 and between the first semiconductor device 103, the second semiconductor device 105, and the third semiconductor device 107. In an embodiment the dielectric material 203 may be a material such as silicon oxide, silicon oxynitride, a high-k dielectric material, combinations of these, or the like, with an etch selectivity different from the CESL 201 so that the dielectric material 203 and the CESL 201 may act as etch stop materials to each other. Additionally, the dielectric material 203 may be formed using a deposition process such as chemical vapor deposition (CVD), physical vapor deposition (PVD), atomic layer deposition (ALD), combinations of these or the like, although any suitable method of manufacturing that may be specific to the particular material may alternatively be utilized. In an embodiment the dielectric material 203 may be deposited to a thickness of between about 1 µm and about 10 µm, such as about 6 µm.

Figure 3:
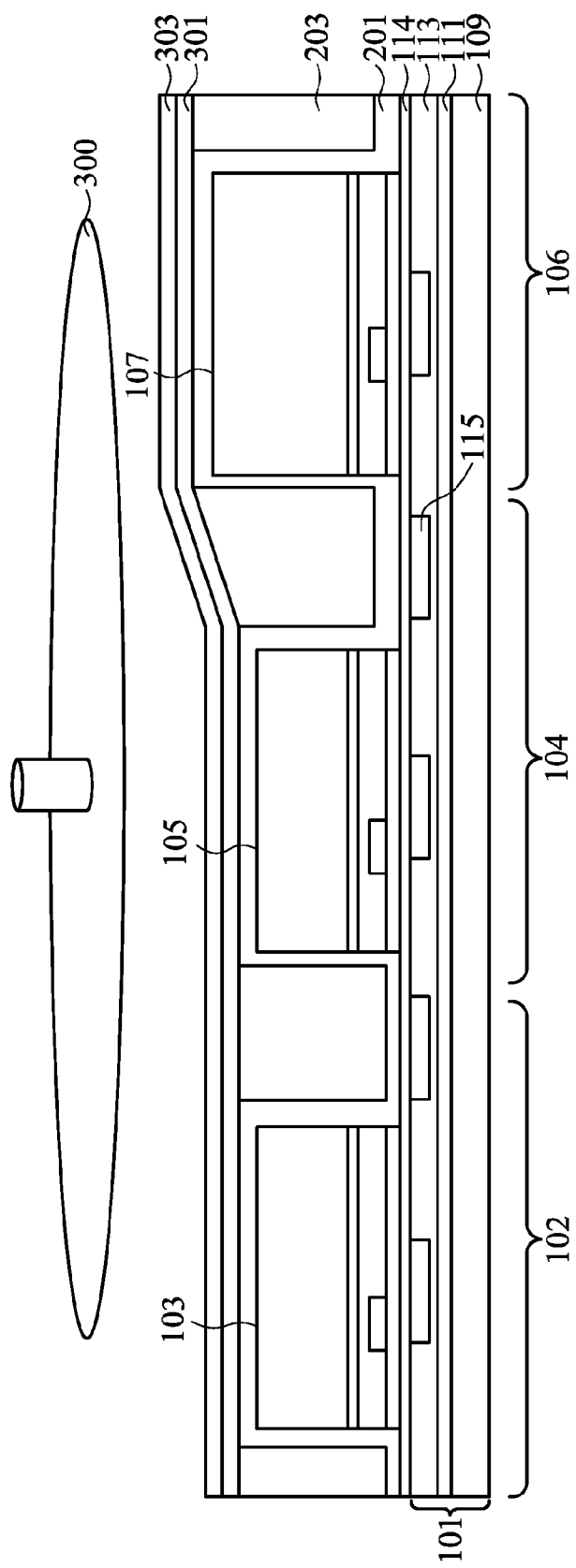
FIG. 3 illustrates a planarization process and a placement of an anti-reflective coating and an intermediate layer, in accordance with some embodiments.

FIG. 3 illustrates a planarization of the dielectric material 203 with the CESL 201. In an embodiment the planarization process is one or more chemical mechanical polishing processes (represented in FIG. 3 by the platen labeled 300), in which etchants and abrasive are applied to the dielectric material 203 and the dielectric material 203 is ground with a platen in order to planarize and remove the dielectric material 203. The CESL 201 will also act as a planarization stop layer such that the planarization process will planarize the dielectric material 203 with the CESL 201.

However, as one of ordinary skill in the art will recognize, the chemical mechanical polishing process described above is intended to be illustrative and is not intended to be limiting upon the embodiments. Rather, any suitable planarization process, such as a physical grinding process or a series of one or more etches, may alternatively be utilized. All such processes are fully intended to be included within the scope of the embodiments.

FIG. 3 additionally illustrates a bottom anti-reflective coating (BARC) layer 301 and an intermediate layer 303 that may be formed over the planarized CESL 201 and dielectric material 203. In an embodiment the BARC layer 301 is applied over the planarized CESL 201 and the dielectric material 203 in preparation for an application of a first photoresist 401 (not illustrated in FIG. 3 but illustrated and described below with respect to FIG. 4). The BARC layer 301, as its name suggests, works to prevent the uncontrolled and undesired reflection of energy (e.g., light) back into the overlying first photoresist 401 during an exposure of the first photoresist 401, thereby preventing the reflecting light from causing reactions in an undesired region of the first photoresist 401.

In an embodiment the BARC layer 301 comprises a polymer resin with a chromophore unit, a catalyst, and a cross-linking agent, all of which are placed into a BARC solvent for dispersal. The cross-linking monomer may be used to cross-link the monomer with other polymers within the polymer resin to modify the solubility of the BARC layer 301, and may optionally have an acid labile group. The catalyst may be a compound that is used to generate a chemically active species and initiate a cross-linking reaction between the polymers within the polymer resin and may be, e.g., thermal acid generator, a photoacid generator, or a photobase generator, suitable combinations of these, or the like. The BARC layer 301 may be utilized by initially applying the material for the BARC layer 301 onto the planarized CESL 201 and dielectric material 203 using, e.g., a spin-on coating process, or the like. In an embodiment the material for the BARC layer 301 may be applied such that it has a thickness over a top of the planarized CESL 201 and dielectric material 203 of between about 50 nm and about 500 nm, such as about 300 nm.

The intermediate layer 303 may be placed over the BARC layer 301. In an embodiment the intermediate layer 303 is a hard mask material such as silicon nitride, oxides, oxynitrides, silicon carbide, combinations of these, or the like. The hard mask material for the intermediate layer 303 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the intermediate layer 303 may be utilized, and all such methods or combination are fully intended to be included within the scope of the embodiments. The intermediate layer 303 may be formed to a thickness of between about 100 Å and about 800 Å, such as about 300 Å.

Figure 4:
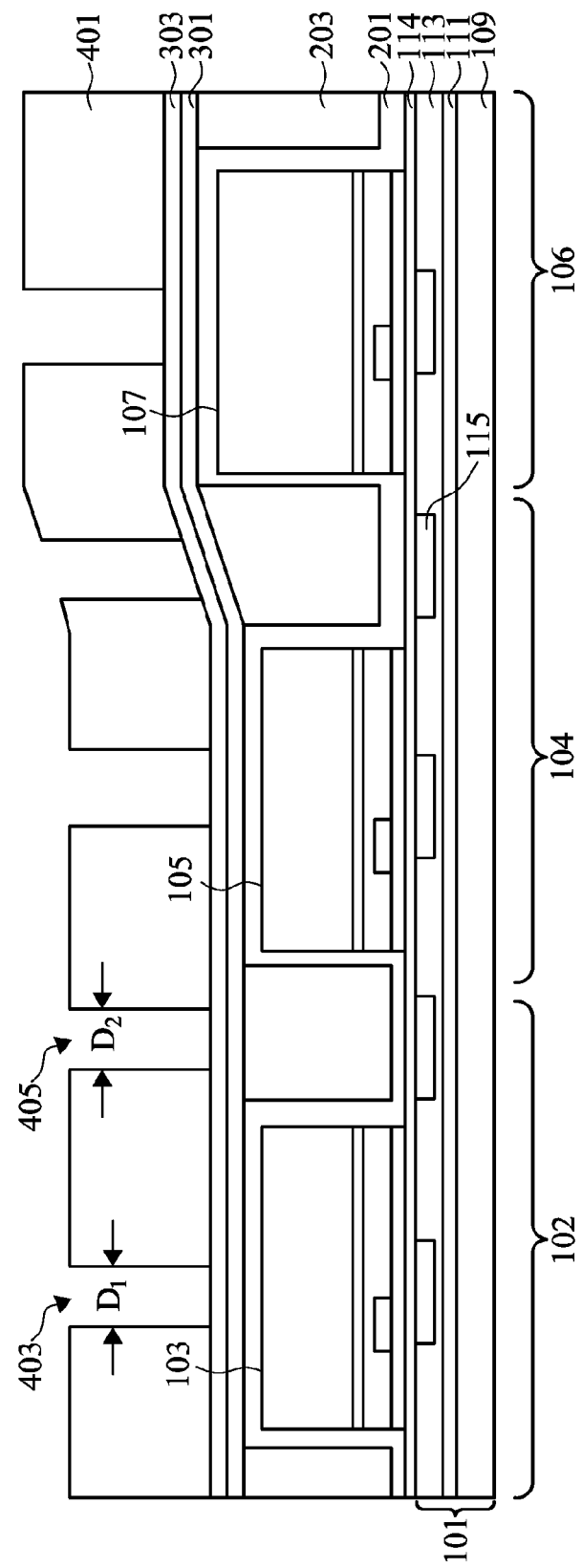
FIG. 4 illustrates a placement of a first photoresist, in accordance with some embodiments.

FIG. 4 illustrates a placement and patterning of the first photoresist 401 over the intermediate layer 303. In an embodiment the first photoresist 401 is a photosensitive material and may be placed on the intermediate layer 303 using, e.g., a spin coating technique to a height of between about 50 µm and about 250 µm, such as about 120 µm. Once in place, the first photoresist 401 may then be patterned by exposing the first photoresist 401 to a patterned energy source (e.g., a patterned light source) so as to induce a chemical reaction, thereby inducing a physical change in those portions of the first photoresist 401 exposed to the patterned light source. A developer is then applied to the exposed first photoresist 401 to take advantage of the physical changes and selectively remove either the exposed portion of the first photoresist 401 or the unexposed portion of the first photoresist 401, depending upon the desired pattern.

The first photoresist 401 is patterned to form first openings 403 over the first semiconductor device 103, the second semiconductor device 105, and the third semiconductor device 107. In an embodiment the first openings 403 will be used to form a conductive connection through the first semiconductor device 103, the second semiconductor device 105, and the third semiconductor device 107. The first openings 403 may be formed to have a first diameter $D_1$ of between about 1 µm and about 10 µm, such as about 6 µm. However, any suitable dimensions and shapes for the first openings 403 may alternatively be utilized.

The first photoresist 401 is also patterned to form second openings 405 over the dielectric material 203 located between the first semiconductor device 103, the second semiconductor device 105, and the third semiconductor device 107. The second openings 405 will be used to form conductive vias through the dielectric material 203 between the first semiconductor device 103, the second semiconductor device 105, and the third semiconductor device 107. In an embodiment the second openings 405 may be formed to have a second diameter $D_2$ of between about 1 μm and about 10 μm, such as about 6 μm. However, any suitable dimensions and shapes for the second openings 405 may alternatively be utilized.

Figure 5A:
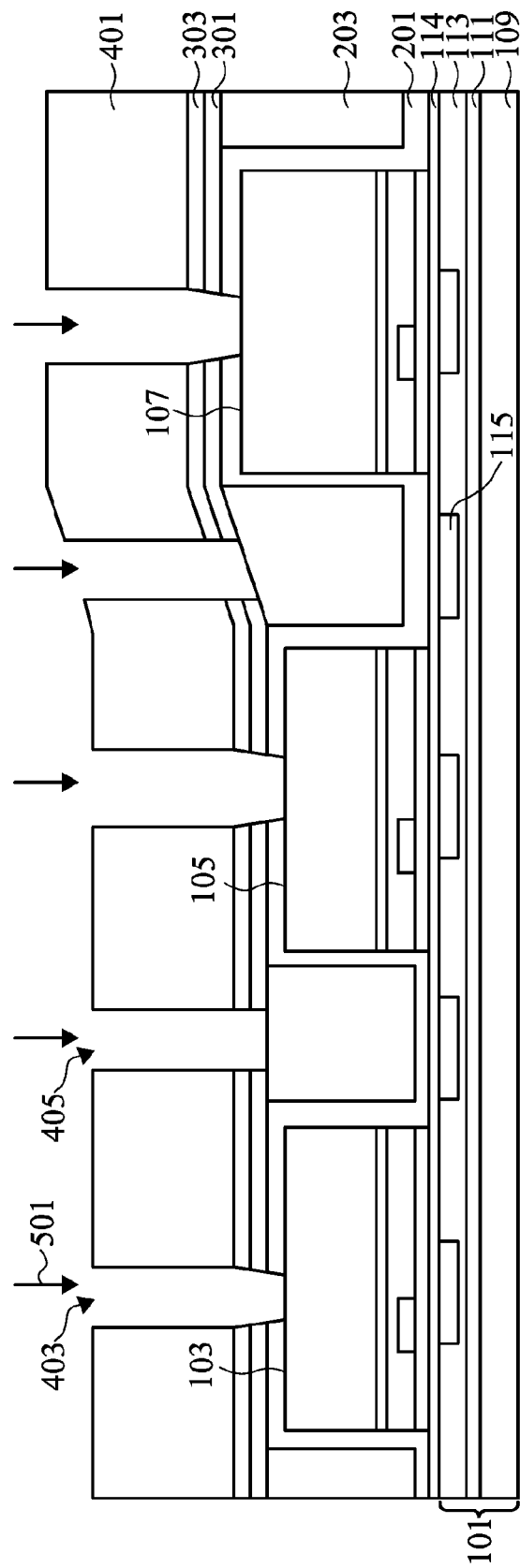
FIGS. 5A-5C illustrate a series of etches that are performed using the first photoresist as a mask, in accordance with some embodiments.

FIG. 5A illustrates that, once the first photoresist 401 has been placed and patterned, a first etching process (represented in FIG. 5A by the arrows labeled 501) may be performed. In an embodiment the first etch process 501 is an anisotropic etch process using the first photoresist 401 as a mask. The first etch process 501 is utilized to transfer the pattern of the first openings 403 and the second openings 405 to the intermediate layer 303, the BARC layer 301, and, where present directly below the BARC layer 301, the CESL 201.

In an embodiment the first etching process 501 may be performed with etchants and process conditions that will extend the first openings 403 through the intermediate layer 303, the BARC layer 301, and the CESL 201. As such, while the precise etchants and process conditions will depend at least in part upon the materials chosen for the intermediate layer 303, the BARC layer 301, and the CESL 201, in an embodiment the first etching process 501 may use an etchant such $CF_4$ or $C_4F_8$, at a temperature of between about 0° C. and about 20° C., such as about 10° C., and a pressure of between about 10 mtorr and about 150 mtorr, such as about 60 mtorr. Furthermore, the RF power may be set to be between about 1200 W and about 2500 W, such as about 1600 W, and the bias may be set at between about 800 W and about 2500 W, such as about 2000 W. However, any suitable process conditions may alternatively be utilized.

However, while the first etching process 501 is utilized to etch through the intermediate layer 303, the BARC layer 301, and the CESL 201 where they are exposed through the first openings 403, the first etching process 501 does not etch the same way through the second opening 405. In particular, because the dielectric material 203 has a different etch selectivity than the CESL 201, the first etching process 501 will remove the intermediate layer 303 and the BARC layer 301 through the second opening 405 but will not remove the dielectric material 203 once the dielectric material 203 has been exposed. In other words, the dielectric material 203 will serve as an etch stop to the first etching process 501. As such, the first etch process 501 will extend the pattern of the second openings 405 through the intermediate layer 303 and the BARC layer 301, but will not significantly remove the dielectric material 203 and will not remove the CESL 201 underlying the dielectric material 203.

Figure 5B:
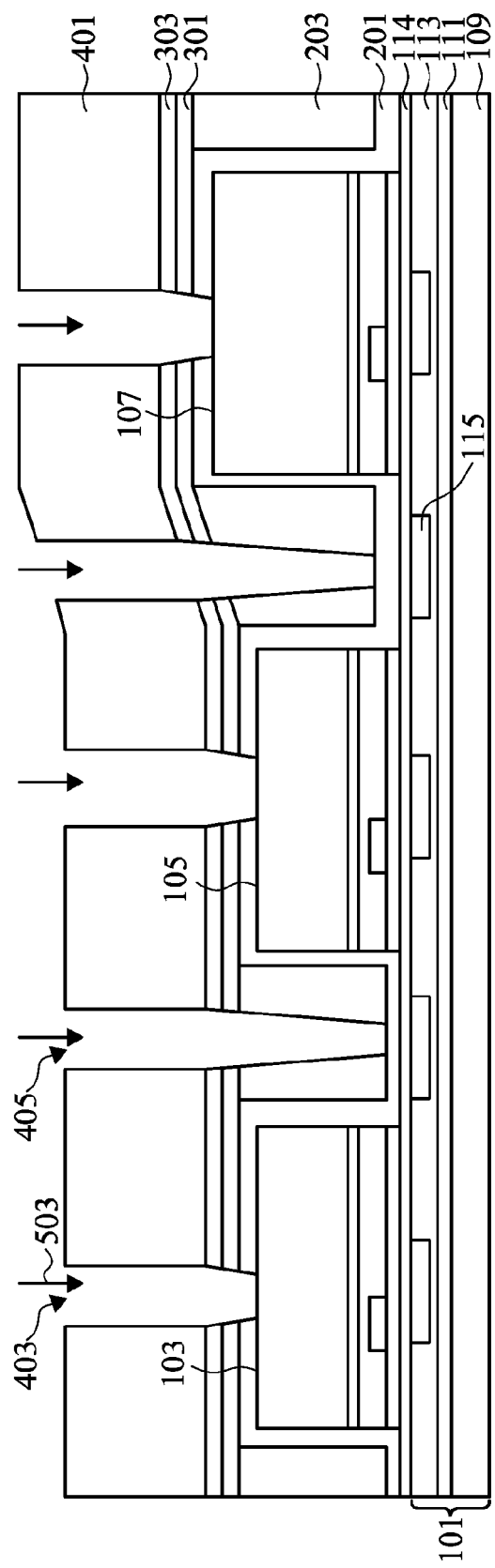

FIG. 5B illustrates a second etching process (represented by the arrows labeled 503) in which the pattern of the second openings 405 is extended through the dielectric material 203. However, the second etching process 503 is also performed to not significantly etch the first semiconductor device 103, the second semiconductor device 105, and the third semiconductor device 107. In particular the second etch process 503 is performed to selectively etch the dielectric material 203 and stopping on the CESL 201 located beneath the dielectric material 203, but to not significantly etch the second substrate 117, the third substrate 125, or the fourth substrate 133 that are exposed by the first etching process 501 through the first openings 403.

In an embodiment the second etching process 503 may be performed with etchants and process conditions that will extend the second openings 405 through the dielectric material 203. As such, while the precise etchants and process conditions will depend at least in part upon the materials chosen for the dielectric material 203, in an embodiment the second etching process 503 is an anisotropic etching process and may use an etchant such $CF_4$ or $C_4F_8$, at a temperature of between about 0° C. and about 20° C., such as about 10° C., and a pressure of between about 10 mtorr and about 150 mtorr, such as about 60 mtorr. Furthermore, the RF power may be set to be between about 1200 W and about 2500 W, such as about 1600 W, and the bias may be set at between about 800 W and about 2500 W, such as about 2000 W. However, any suitable process conditions may alternatively be utilized.

Figure 5C:
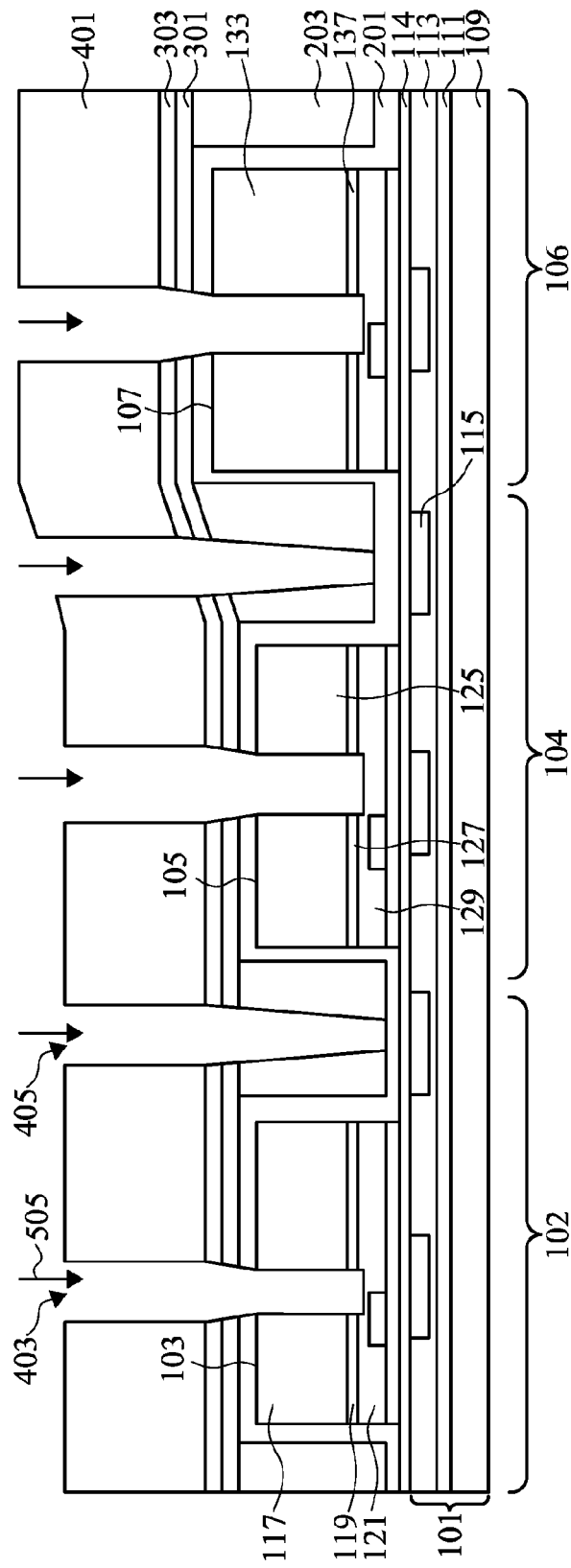

FIG. 5C illustrates a third etching process (represented in FIG. 5C by the arrows labeled 505). In an embodiment the third etching process 505 is utilized to etch through the second substrate 117 (of the first semiconductor device 103), the third substrate 125 (of the second semiconductor device 105), and the fourth substrate 133 (of the third semiconductor device 107) that are exposed through the first openings 403. However, the third etch process 505 does not etch through the CESL 201 located beneath the dielectric material 203 and exposed through the second openings 405.

In an embodiment the third etching process 505 may be performed with etchants and process conditions that will extend the first openings 403 through the second substrate 117, the third substrate 125, and the fourth substrate 133, and also through the second active device layer 119, the third active device layer 127, and the fourth active device layer 135, and partially into the second metallization layer 121, the third metallization layer 129, and the fourth metallization layer 137. As such, while the precise etchants and process conditions will depend at least in part upon the materials chosen for these layers, in an embodiment the third etching process 505 is an anisotropic etching process and may use an etchant such $SF_6$ or Ar, at a temperature of between about −10° C. and about 10° C., such as about 3° C., and a pressure of between about 10 mtorr and about 100 mtorr, such as about 60 mtorr. Furthermore, the RF power may be set to be between about 1000 W and about 5000 W, such as about 3000 W, and the bias may be set at between about 50 V and about 1000 V, such as about 100 V. However, any suitable process conditions may alternatively be utilized.

In an embodiment the first etching process 501, the second etching process 503, and the third etching process 505 may all be performed within a single etching chamber without breaking vacuum and exposing the structure to an ambient atmosphere. However, alternative etching chambers, or even different cluster tools, may also be utilized. Any suitable number or combination of machines may be used, and all such combinations are fully intended to be included within the scope of the embodiments.

Figure 6:
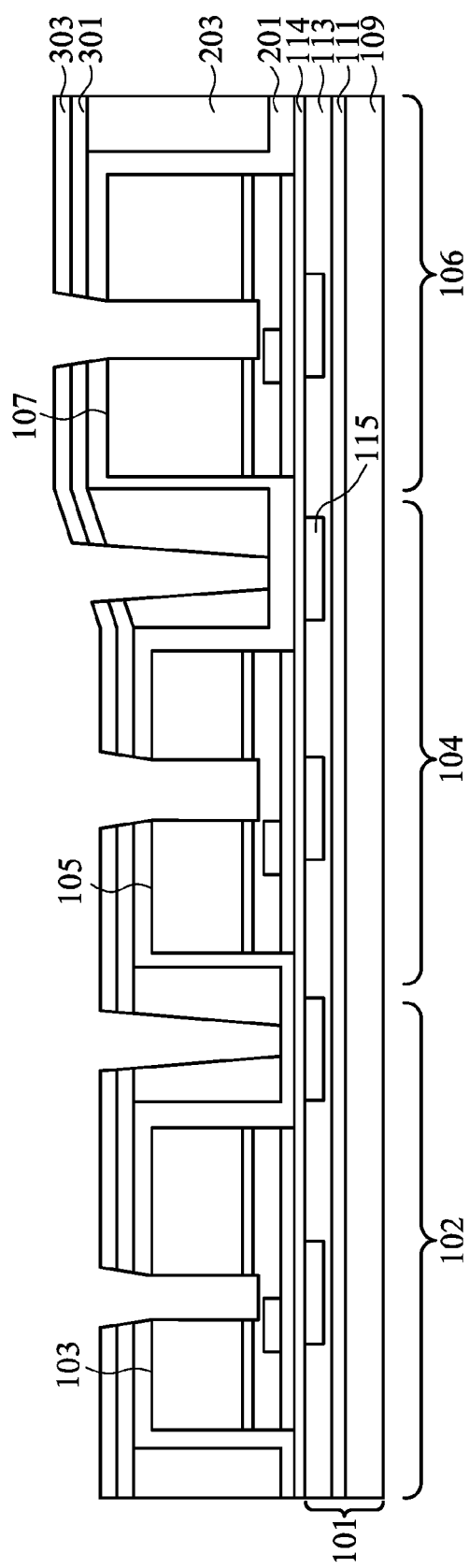
FIG. 6 illustrates a removal of the first photoresist, in accordance with some embodiments.

FIG. 6 illustrates a removal of the first photoresist 401 and a post removal cleaning process. In an embodiment the first photoresist 401 may be removed utilizing, e.g., an ashing process, whereby a temperature of the first photoresist 401 is raised until the first photoresist 401 experiences a thermal decomposition and may be easily removed. However, any other suitable removal process may alternatively be utilized.

Once the ashing process has been performed, the structure may be cleaned using a first cleaning process in order to help assist in the removal of the first photoresist 401. In an embodiment the cleaning step may include dipping the first semiconductor device 103, the second semiconductor device 105, and the third semiconductor device 107 into an etchant in order to ensure that any remaining portions of the first photoresist 401 are removed from the first semiconductor device 103, the second semiconductor device 105, and the third semiconductor device 107 prior to subsequent processing. For example, the first semiconductor device 103, the second semiconductor device 105, and the third semiconductor device 107 may be dipped into an etchant such as HF for between about 10 seconds and about 30 seconds, such as about 20 seconds.

Figure 7:
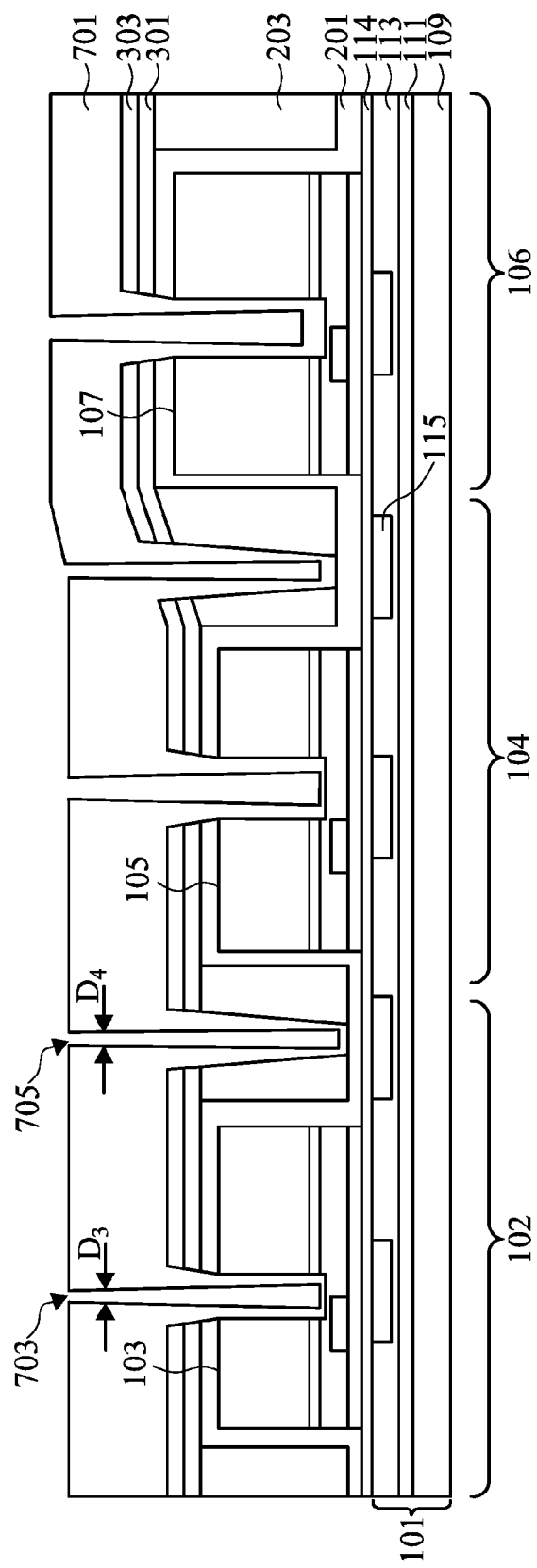
FIG. 7 illustrates a deposition of a liner material, in accordance with some embodiments.

FIG. 7 illustrates a deposition of a liner material 701 over the intermediate layer 303 and lining the first openings 403 (now extended through the first semiconductor device 103, the second semiconductor device 105, and the third semiconductor device 107) and lining the second openings 405 (now extending through the dielectric material 203. In an embodiment the liner material 701 is a dielectric material such as silicon oxide, silicon nitride, or the like in order to isolate the first semiconductor device 103, the second semiconductor device 105, and the third semiconductor device 107 for a subsequently formed conductive material 902 (not illustrated in FIG. 7 but illustrated and described below with respect to FIG. 9).

The liner material 701 may be deposited by chemical vapor deposition (CVD) or any other suitable deposition process and may be formed to a thickness over the intermediate layer 303 of between about 100 Å and about 10000 Å, such as about 4000 KÅ. Additionally, the liner material 701 is deposited to line the first openings 403 and the second openings 405, but not to fill the first openings 403 and the second openings 405. As such, the liner material 701 may be deposited to form a third opening 703 within the first openings 403 and a fourth opening 705 within the second openings 405. In an embodiment the third opening 703 may have a third diameter $D_3$ of between about 0.6 µm and about 3 µm, such as about 1.5 µm, while the fourth opening 705 may have a fourth diameter $D_4$ of between about 0.6 µm and about 3 µm, such as about 2 µm.

Figure 8:
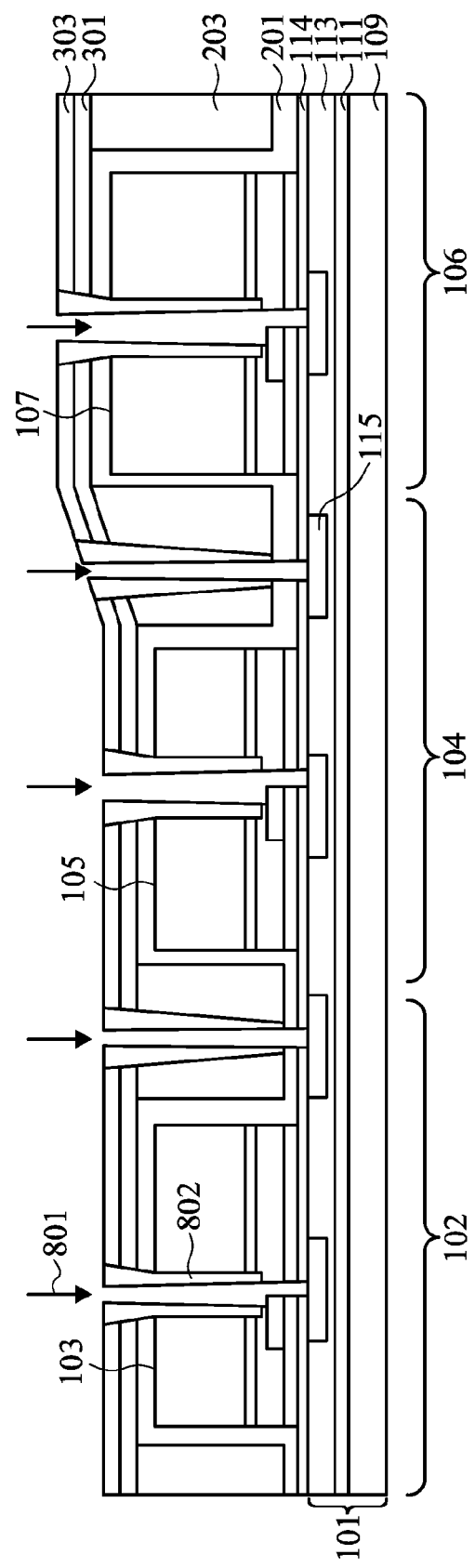
FIG. 8 illustrates an etching of the liner material, in accordance with some embodiments.

FIG. 8 illustrates a fourth etching process (represented in FIG. 8 by the arrows labeled 801). The fourth etching process 801 will remove the liner material 701 from over the intermediate layer 303 as well as removing the liner material 701 from the bottom of the third openings 703 and the fourth openings 705 without significantly removing the liner material 701 from the sidewalls of the third openings 703 and the fourth openings 705. Such a removal of the liner material 701 that leaves a portion on the sidewalls of the third openings 703 and the fourth openings 705 form self-aligned spacers 802 along at least a portion of the sidewalls of the third openings 703 and the fourth openings 705.

Additionally, once the liner material 701 has been removed from the bottom of the third openings 703 and the fourth openings 705, the fourth etching process 801 will proceed to extend the third openings 703 through the first semiconductor device 103, the second semiconductor device 105, and the third semiconductor device 107 and exposes the first contact pads 115 on the first wafer 101. Additionally, if desired, the third openings 703 may also expose the second contact pads 123 (on the first semiconductor device 103), the third contact pads 131 (on the second semiconductor device 105), and the fourth contact pads 139 (on the third semiconductor device 107).

Additionally, the fourth etching process 801 will also extend the fourth openings 705 through the CESL 201 (first exposed during the second etching process 503) to expose additional first contact pads 115 on the first wafer 101. Such an extension of the fourth openings 705 provides a direct pathway through the dielectric material 203 that bypasses the first semiconductor device 103, the second semiconductor device 105, and the third semiconductor device 107.

In an embodiment the fourth etching process 801 may be performed with etchants and process conditions that will extend the third openings 703 and the fourth openings 705. As such, while the precise etchants and process conditions will depend at least in part upon the materials chosen for the various layers, in an embodiment the fourth etching process 801 is an anisotropic etching process and may use an etchant such $CF_4$ or $C_4F_8$, at a temperature of between about 0° C. and about 20° C., such as about 10° C., and a pressure of between about 10 mtorr and about 150 mtorr, such as about 60 mtorr. Furthermore, the RF power may be set to be between about 1200 W and about 2500 W, such as about 1600 W, and the bias may be set at between about 800 W and about 2500 W, such as about 2000 W. However, any suitable process conditions may alternatively be utilized.

Figure 9:
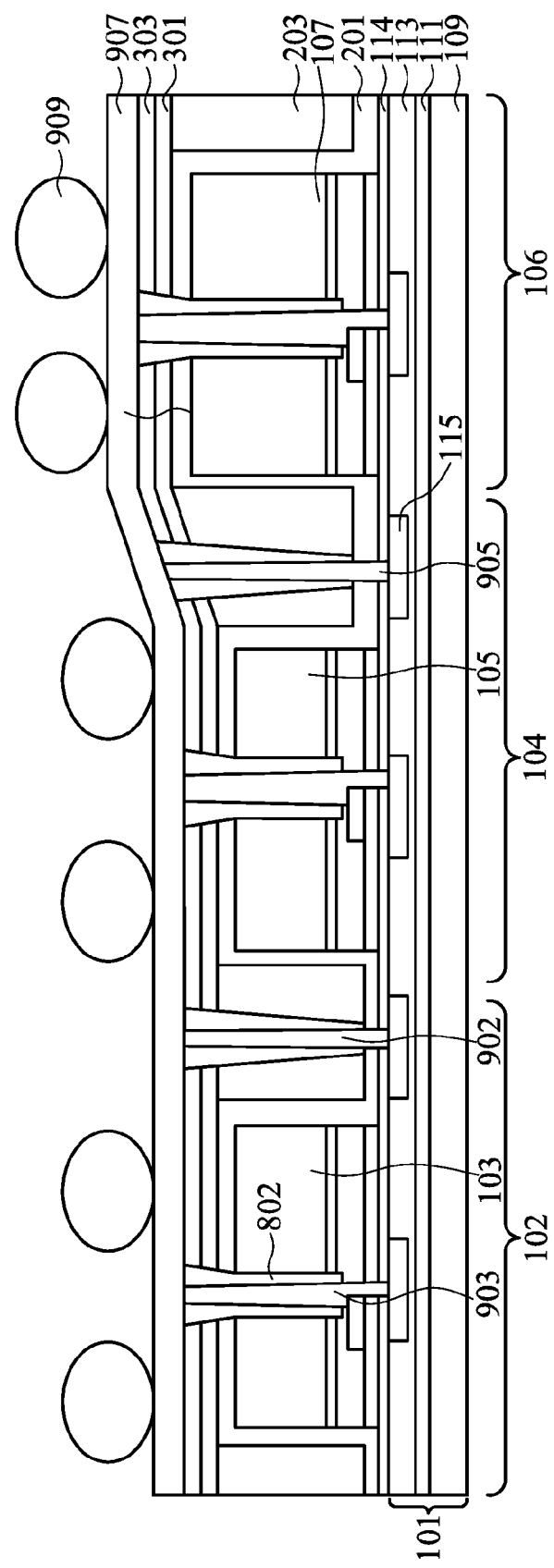
FIG. 9 illustrates a formation of through silicon vias and through dielectric vias, in accordance with some embodiments.

FIG. 9 illustrates a filling of the third openings 703 and the fourth openings 705 with a conductive material 902 in order to form through substrate vias 903 within the third openings 703 (and thus through the first semiconductor device 103, the second semiconductor device 105, and the third semiconductor device 107) and to form through dielectric vias 905 through the dielectric material 203 (between the first semiconductor device 103 and the second semiconductor device 105 and between the second semiconductor device 105 and the third semiconductor device 107). In an embodiment the third openings 703 and the fourth openings 705 may be filled with a barrier layer (not shown) and a conductive material 902 to form the through substrate vias 903 and the through dielectric vias 905. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer is formed so as to contour to the underlying shape of the third openings 703 and the fourth openings 705.

The conductive material 902 may comprise copper, although other suitable materials such as aluminum, alloys, doped polysilicon, combinations thereof, and the like, may alternatively be utilized. The conductive material 902 may be formed by depositing a seed layer and then electroplating copper onto the seed layer, filling and overfilling the third openings 703 and the fourth openings 705. Once the third openings 703 and the fourth openings 705 have been filled, excess barrier layer and excess conductive material 902 outside of the third openings 703 and the fourth openings 705 are removed through a grinding process such as chemical mechanical polishing (CMP), although any suitable removal process may be used.

Once the through substrate vias 903 and the through dielectric vias 905 have been formed, a redistribution layer 907 may be formed in order to either interconnect the through substrate vias 903 and the through dielectric vias 905, or else to provide connectivity between the through substrate vias 903 and the through dielectric vias 905 and, e.g., external connections 909 (discussed further below). In an embodiment the redistribution layer 907 is formed by initially forming a seed layer (not separately illustrated) of, e.g., a titanium copper alloy through a suitable formation process such as CVD or sputtering. A second photoresist (also not shown) may then be formed to cover the seed layer, and the second photoresist may then be patterned to expose those portions of the seed layer that are located where the redistribution layer 907 is desired to be located.

Once the second photoresist has been formed and patterned, a conductive material for the redistribution layer, such as copper, may be formed on the seed layer through a deposition process such as plating. The conductive material for the redistribution layer may be formed to have a thickness of between about 1 μm and about 10 μm, such as about 5 μm, and a width of between about 5 μm and about 300 μm, such as about 5 μm. However, while the material and methods discussed are suitable to form the conductive material, these materials are merely exemplary. Any other suitable materials, such as AlCu or Au, and any other suitable processes of formation, such as CVD or PVD followed by a patterning process, may alternatively be used to form the redistribution layer 907.

Once the conductive material for the redistribution layer has been formed, the second photoresist may be removed through a suitable removal process such as ashing. Additionally, after the removal of the second photoresist, those portions of the seed layer that were covered by the second photoresist may be removed through, for example, a suitable etch process using the conductive material as a mask.

The conductive material for the redistribution layer may then be covered by a dielectric material (not separately illustrated in FIG. 9) in order to protect the conductive material for the redistribution layer. In an embodiment the dielectric material may be silicon oxide or other dielectric material formed through a suitable method such as chemical vapor deposition. Once covered, the process may be repeated in order to form additional redistribution layers until a desired number of layers is reached.

FIG. 9 also illustrates that, once the redistribution layer 907 has been formed, external connections 909 may be formed in electrical connection with the redistribution layer 907 in order to provide connectivity to, e.g., external devices (not separately illustrated in FIG. 9). The external connections 909 may be contact bumps such as ball grid array bumps, microbumps, or controlled collapse chip connection (C4) bumps and may comprise a material such as tin, or other suitable materials, such as silver or copper. In an embodiment in which the external connections 909 are tin solder bumps, the external connections 909 may be formed by initially forming a layer of tin through any suitable method such as evaporation, electroplating, printing, solder transfer, ball placement, etc, to a thickness of about 100 μm. Once a layer of tin has been formed on the structure, a reflow is performed in order to shape the material into the desired bump shapes.

Figure 10:
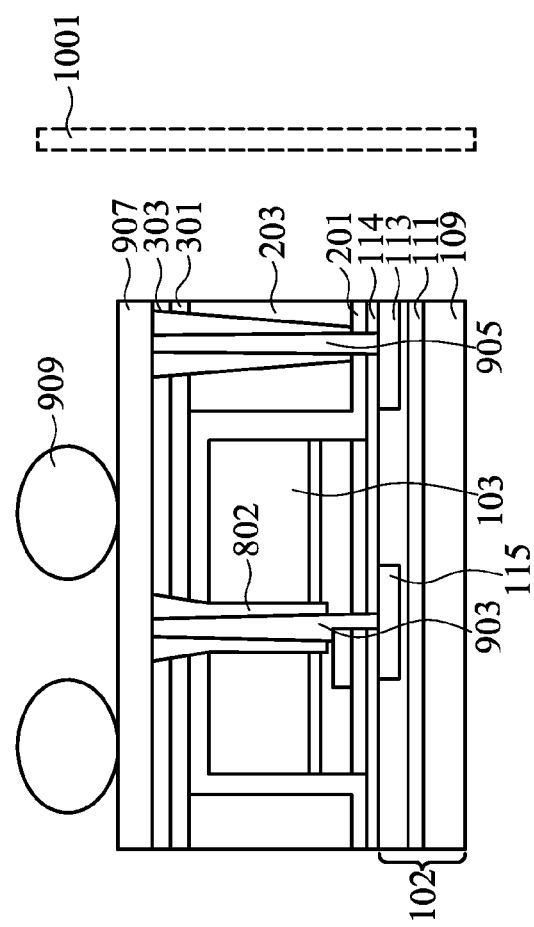
FIG. 10 illustrates a singulation of the first wafer, in accordance with some embodiments.

FIG. 10 illustrates a singulation of the first wafer 101 into separate devices. In an embodiment the singulation may be performed by using a saw blade (represented in FIG. 10 by the dashed box labeled 1001) to slice through the dielectric material 203 between the first semiconductor device 103 and the second semiconductor device 105. However, the singulation process will slice through the dielectric material 203 on one side of the through dielectric via 905, so that the through dielectric via 905 within the dielectric material 203 adjacent to the first semiconductor device 103 remains with the structure of the first semiconductor device 103 when the first wafer 101 is singulated.

Additionally, as one of ordinary skill in the art will recognize, utilizing a saw blade to singulate the first wafer 101 is merely one illustrative embodiment and is not intended to be limiting. Alternative methods for singulating the first wafer 101, such as utilizing one or more etches to separate the first semiconductor device 103, the second semiconductor device 105, and the third semiconductor device 107, may alternatively be utilized. These methods and any other suitable methods may alternatively be utilized to singulate the first wafer 101.

By implementing the CESL 201 along with the dielectric material 203, a single mask process utilizing the first photoresist 401 may be used to generate a heterogeneous interconnect structure with both the through substrate vias 903 and the through dielectric vias 905. The use of the CESL 201 will also contribute as a moisture blocker to prevent undesired penetration of moisture.

In accordance with an embodiment, a semiconductor device comprising a first semiconductor die bonded to a second semiconductor die is provided. A contact etch stop layer is in physical contact with at least three sides of the first semiconductor die and a top surface of the second semiconductor die. A dielectric material is on an opposite side of the contact etch stop layer than the second semiconductor die and having a top surface planar with the contact etch stop layer. A first through via extends through the contact etch stop layer and the first semiconductor die, and a second through via extending through the dielectric material and the contact etch stop layer.

In accordance with another embodiment, a semiconductor device comprising a first semiconductor die bonded to a second semiconductor die is provided. A first through via extends through an etch stop layer and the first semiconductor die, wherein the first semiconductor die is between the etch stop layer and the second semiconductor die. A second through via extends through a dielectric material and the etch stop layer, wherein the etch stop layer is between the dielectric material and the second semiconductor die.

In accordance with yet another embodiment, a method of manufacturing a semiconductor device comprising bonding a first semiconductor die and a second semiconductor die to a wafer is provided. A etch stop layer is deposited over the first semiconductor die and the second semiconductor die. A dielectric material is deposited over the etch stop layer between the first semiconductor die and the second semiconductor die. A first etch process is performed to pattern the etch stop layer over the first semiconductor die and the second semiconductor die but not the etch stop layer beneath the dielectric material. A second etch process is performed to form a first opening in the dielectric material. A third etch process is performed to form a second opening in the first semiconductor die. A liner material is deposited within the first opening and the second opening. The first semiconductor die below the first opening and the etch stop layer below the second opening are etched using the liner material as a mask. A remainder of the first opening and the second opening is filled with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor die bonded to a second semiconductor die;
   a contact etch stop layer in physical contact with at least three sides of the first semiconductor die and a top surface of the second semiconductor die;
   a dielectric material on an opposite side of the contact etch stop layer than the second semiconductor die and having a top surface planar with the contact etch stop layer, wherein the dielectric material extends from the top surface of the dielectric material to an opposite surface of the dielectric material, wherein the opposite surface is in contact with the contact etch stop layer;
   a first through via extending through the contact etch stop layer and the first semiconductor die; and
   a second through via extending through the dielectric material and the contact etch stop layer.

2. The semiconductor device of claim 1, wherein the first through via extends to the second semiconductor die.

3. The semiconductor device of claim 1, wherein the first through via is at least partially lined with a dielectric material.

4. The semiconductor device of claim 3, wherein the dielectric material covers only a portion of a sidewall of the first through via.

5. The semiconductor device of claim 1, wherein the first through via makes physical contact with a first contact pad within the first semiconductor die and a second contact pad within the second semiconductor die.

6. The semiconductor device of claim 1, wherein the first through via has a first top surface, the second through via has a second top surface, and the first top surface is planar with the second top surface.

7. The semiconductor device of claim 1, further comprising an anti-reflective layer over the first semiconductor die and the dielectric material, wherein the first through via extends through the anti-reflective layer.

8. A semiconductor device comprising:
   a first semiconductor die bonded to a second semiconductor die;
   a first through via extending through an etch stop layer and the first semiconductor die, wherein the first semiconductor die is between the etch stop layer and the second semiconductor die; and
   a second through via extending through a dielectric material and the etch stop layer, wherein the second through via is laterally removed from the first semiconductor die, wherein the etch stop layer is in physical contact with the dielectric material and wherein the etch stop layer is between the dielectric material and the second semiconductor die.

9. The semiconductor device of claim 8, further comprising a redistribution layer in electrical connection with the second through via.

10. The semiconductor device of claim 9, further comprising external connections in electrical contact with the redistribution layer.

11. The semiconductor device of claim 8, further comprising a liner material lining the first through via.

12. The semiconductor device of claim 11, wherein the liner material extends along only a portion of a sidewall of the first through via.

13. The semiconductor device of claim 8, wherein the first through via extends to the second semiconductor die.

14. The semiconductor device of claim 8, further comprising an anti-reflective layer over the etch stop layer and the dielectric material.

15. A semiconductor device comprising:
   a first semiconductor die with a first contact pad and a second contact pad;
   a second semiconductor die over and bonded to the first semiconductor die, the second semiconductor die comprising a third contact pad;
   a contact etch stop layer lining the second semiconductor die and extending over the second contact pad;
   dielectric material located on an opposite side of the contact etch stop layer from the second semiconductor die and also located over the second contact pad, wherein the dielectric material has a surface facing away from the first semiconductor die that is planar with the contact etch stop layer;
   a first via extending through the first semiconductor die and at least partially covering both a first surface of the first contact pad and a second surface of the third contact pad, wherein the first surface faces a first direction and the second surface faces the first direction; and
   a second via extending through the dielectric material and the contact etch stop layer, wherein the second via is separated from the dielectric material by a first self-aligned spacer.

16. The semiconductor device of claim 15, wherein the first via extends through the contact etch stop layer.

17. The semiconductor device of claim 15, further comprising a bottom anti-reflective coating layer in physical contact with the contact etch stop layer and the dielectric material, wherein both the first via and the second via extend through the bottom anti-reflective coating layer.

18. The semiconductor device of claim 17, further comprising an intermediate layer in physical contact with the bottom anti-reflective coating layer, wherein both the first via and the second via extend through the intermediate layer.

19. The semiconductor device of claim 18, further comprising a redistribution layer over the intermediate layer and in electrical connection with both the first via and the second via.

20. The semiconductor device of claim 15, further comprising a second self-aligned spacer between the first via and at least a portion of the first semiconductor die, wherein the second self-aligned spacer in separated from the third contact pad.

* * * * *